United States Patent [19]

May, Jr. et al.

[11] Patent Number: 4,740,532
[45] Date of Patent: Apr. 26, 1988

[54] PHOTOCURABLE DIELECTRIC COMPOSITION OF ACRYLATED URETHANE PREPOLYMER

[75] Inventors: Clifton C. May, Jr., Luisville KY.; Steven G. Wentink, Downer's Grove, ILL.

[73] Assignee: AMP Incorporated, Harrisburg, Pa.

[21] Appl. No.: 940,189

[22] Filed: Dec. 9, 1986

Related U.S. Application Data

[63] Continuation of Ser. No. 728,895, Apr. 30, 1985, abandoned.

[51] Int. Cl.$^4$ .................. C08L 75/04; C09D 5/25; H01B 3/44
[52] U.S. Cl. .................................. 522/34; 522/90; 522/95; 525/455
[58] Field of Search .................. 525/455, 529, 350

[56] References Cited

U.S. PATENT DOCUMENTS

| | | | |
|---|---|---|---|
| 3,847,767 | 11/1974 | Kloczenski | 430/ |
| 4,006,270 | 2/1977 | Morgan | 525/350 |
| 4,113,981 | 9/1978 | Fujita et al. | 252/511 |
| 4,204,010 | 5/1980 | Kramm et al. | 427/44 |
| 4,280,888 | 7/1981 | Bush et al. | 427/44 |
| 4,305,854 | 12/1981 | Rowe | 525/455 |
| 4,309,526 | 1/1982 | Baccei | 525/455 |
| 4,330,657 | 5/1982 | Disteldorf | 525/455 |
| 4,390,662 | 6/1983 | Ando | 525/455 |
| 4,423,435 | 12/1983 | Test, II | 357/65 |
| 4,451,636 | 5/1984 | Tsao | 525/455 |
| 4,554,033 | 11/1985 | Dery | 156/291 |
| 4,588,456 | 5/1986 | Dery | 156/295 |

OTHER PUBLICATIONS

"Conductive Epoxy is Tested for SMT Solder Replacement", by Ronald Pound, Feb. 1985, pp. 84–90.

*Primary Examiner*—Christopher Henderson
*Attorney, Agent, or Firm*—Katherine A. Nelson

[57] ABSTRACT

A dielectric coating composition that is screen printable and radiation curable is disclosed. The composition is composed of from about 10 percent to about 50 percent of an unsaturated thiolene prepolymer system, from about 0 percent to about 35 percent of an acrylated prepolymer system, from about 10 percent to about 40 percent of at least one crosslinking diluent monomer, from about 4 percent to about 18 percent of at least one plasticizer and from about 3 percent to about 12 percent of at least one nonshrinking monomer. The cured coating is sufficiently compliant at normal temperatures to avoid cracking upon flexure of thermal expansion of the substrate.

14 Claims, 1 Drawing Sheet

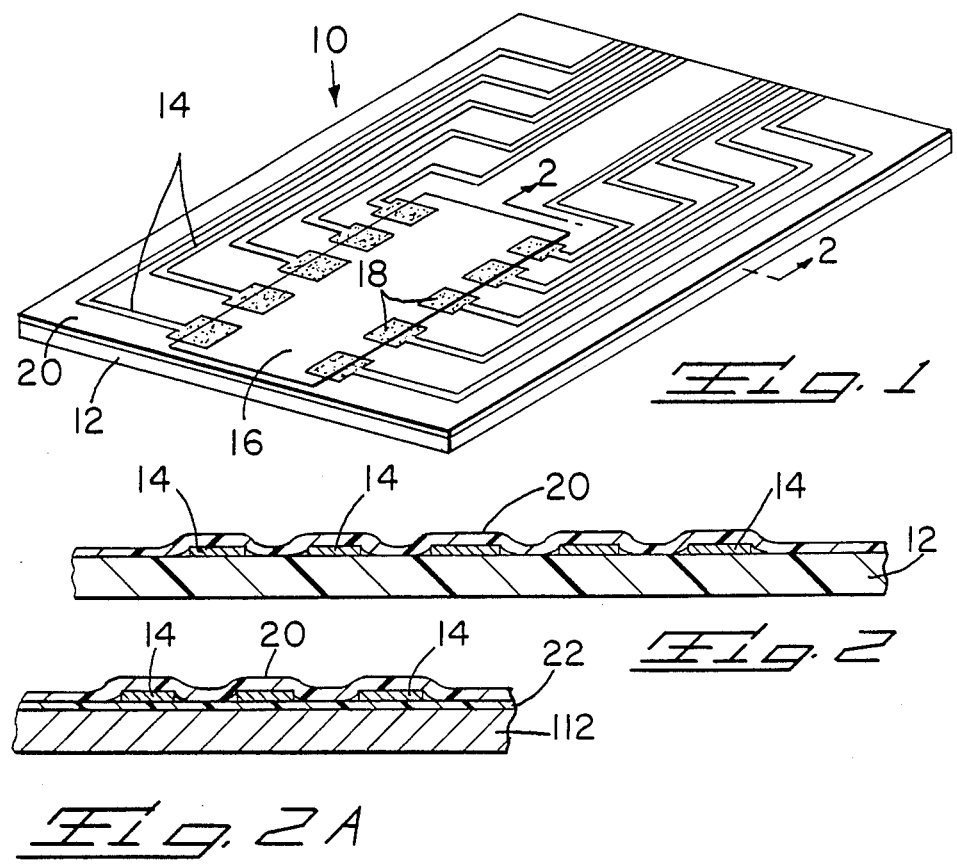
*Fig. 1*
*Fig. 2*
*Fig. 2A*
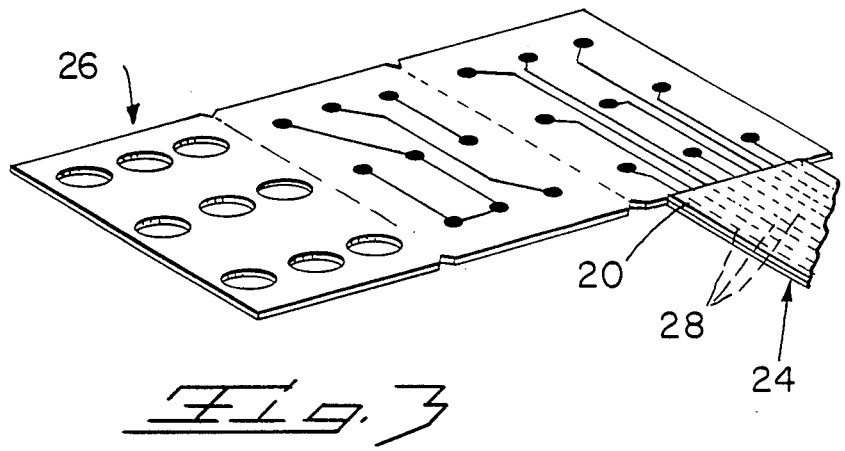
*Fig. 3*

PHOTOCURABLE DIELECTRIC COMPOSITION OF ACRYLATED URETHANE PREPOLYMER

This application is a continuation of application Ser. No. 728,895, filed Apr. 30, 1985, now abandoned.

FIELD OF THE INVENTION

This invention relates to dielectric coating compositions and more particularly to screen printable dielectric compositions for use on flexible substrates and rigid substrates that have a high coefficient of thermal expansion.

BACKGROUND OF THE INVENTION

As the use of flexible substrates for membrane switch assemblies, flexible circuit panel assemblies and the like increases, there is a concomitant demand for screen printable dielectric coating compositions that are compatible with the flexible substrates.

As used herein the term "screen printable" means that a screen is imaged and the coating is applied only to the desired area rather than completely covering the surface of the substrate. Dielectric coatings used for ceramic components and rigid circuit panel assemblies are generally unsuitable because of high curing temperatures and because they generally produce brittle coatings. These coatings, therefore, are incompatible with flexible substrates. The flexible substrate deteriorates at the curing temperature and the coatings crack when the substrate is flexed, bent or folded.

Current means for meeting industries' needs include the use of additional layers of film which are laminated over the area to be insulated. The use of additional layers of film, however, increases the cost of the product, the number of manufacturing processing steps and the type of manufacturing equipment needed.

Various problems are associated with the formulation of dielectric coatings particularly for substrates having polymeric conductors, and/or conductive ink circuitry. Use of a solvent based coating composition may cause underlying polymeric conductors to deteriorate. Epoxy based systems generally produce coatings that are not sufficiently compliant for use on flexible substrates. In addition they often require curing temperatures that are detrimental to flexible substrates.

It is an object of this invention to provide a dielectric coating composition that is compatible with commerical conductive inks, present manufacturing processes and existing equipment.

Futhermore, it is an object of this invention to provide a dielectric coating that will be compliant and will not crack when the underlying substrate is flexed, bent or folded, and in addition will be sufficiently compliant to accommodate relative movement between circuit members and substrate caused by different coefficients of expansion. It is also an object of the invention to provide a coating that will adhere well to a variety of substrates including flexible substrates such as polyesters, polyimides, polycarbonates, as well as more rigid substrates including phenolics, fiberglass and metals such as aluminum.

These and other objects and advantages of the present invention are achieved by the dielectric coating composition disclosed herein.

The coating composition is comprised of a homogeneous mixture of from about 10 percent to about 50 percent, preferably 20 percent to 35 percent of an unsaturated thiolene prepolymer system; from about 0 percent to about 35 percent, preferably 20 percent to 25 percent of an acrylated prepolymer system, from about 10 percent to about 40 percent, preferably 15 percent to 25 percent of at least one crosslinking diluent monomer and from about 4 percent to about 18 percent, preferably 7.5 percent to 12 percent of at least one plasticizer. From about 3 percent to about 12 percent, preferably 5 percent to 10 percent of at least one nonshrinking monomer may be added to control the shrinkage of the cured coating. Fillers, photoinitiators, catalysts, adhesion promotors and flow agents may also be added depending upon the method used to apply and polymerize the coating layer.

The coating composition in the preferred embodiment is screen printable using techniques known in the art and is radiation curable. The dielectric coating composition is applied selectively to insulate the conductor members in the desired areas on the substrate using screen printing techniques as known in the industry. The coating is cured by ultraviolet light. The compliance of the cured dielectric layer accommodates the limited relative movement between the conductors and the substrate resulting from different coefficients of thermal expansion or from flexure of the substrate.

Some of the objects, advantages and uses of the invention having been stated, others will appear as the description proceeds, when taken in conjunction with the accompanying drawings.

BRIEF DESCRIPTION OF THE DRAWINGS

FIG. 1 is a perspective view of a circuit panel having a dielectric cover layer in accordance with the present invention.

FIG. 2 is a cross sectional view of a circuit panel of view 1 having a dielectric cover layer in accordance with the present invention.

FIG. 2A is a view similar to that of FIG. 2 illustrating the dielectric cover layer of this invention on an insulated metal substrate.

FIG. 3 is a membrane switch assembly having a dielectric cover layer in accordance with the present invention.

DESCRIPTION OF THE PREFERRED EMBODIMENT

The composition of the preferred embodiment is comprised of from 20 percent to 35 percent of an unsaturated thiolene prepolymer system, from 10 to 25 percent of an acrylated prepolymer system, from 15 percent to 25 percent of a plurality of crosslinking monomers, from 7.5 percent to 12 percent of a plasticizer, from 5 percent to 10 percent of a nonshrinking monomer, 15 percent to 25 percent filler and 3 percent to 5 percent of a photoinitiator. A mixture of suitable thiolene prepolymer system, the crosslinking diluent monomers, filler, and a partial pecentage of plasticizer and photoinitiator is sold under the name of FLEXCOAT available from W. R. Grace Co., New York, N.Y. FLEXCOAT is a trademark of W. R. Grace for a screenable photopolymer solder resist which cures through the application of ultraviolet light. A process for using a printable photocurable solder resist and formulations for such resists are disclosed in U.S Pat. No. 3,847,767 owned by W. R. Grace Co. The acrylated prepolymer system, and additional quantities of monomers, plasticizer, and photoinitiator are added to the FLEXCOAT mixture to provide improved printability, flexibility, shrinkage control and adhesion. The unsaturated prepolymer system used is an acrylated urethane prepolymer. A suitable acrtylated prepolymer system is sold under the designation PURELAST 169 which is available from Polymer Systems Corporation, New Brunswick, N.J. The plasticizer for the preferred embodiment is diallyl phthalate. One source for diallyl phthalate is Fisher Scientific Co., Pittsburgh, Pa. Shrinkage of the cured layer is controlled by the addition of n-vinyl pyrollidone, a monofunctional acrylated monomer. A suitable radiation grade M-vinyl pyrollidone is available from GAF Corp., New York, N.Y., and is sold under the name U-PYROL-RG. 2,2-demethoxy-2-phenyacetophenone is used as a photoinitiator. This photoinitiator is available from Ciba Geigy Corporation, Ardsley, N.Y., and is sold under the trade name IRGACURE 651. An organosilane may be added as an adhesion promoter particularly helpful when the basic substrate is a polyimide such as KAPTON a trademark of E. I. DuPont de Nemours and Co., Wilmington, Del., and the electrical conductors are metal. It is to be understood that other acrylated prepolymer systems, such as an epoxy system, photoinitiators and monomers that are compatible with the thiolene prepolymer system may be used in the coating composition.

It is preferable that the prepolymer system or systems used have basic adhesive and flexibility properties. Adhesion flexibility, viscosity and other properties of the coating composition can be controlled by the additives used. It is preferred that polymerization be initiated by actinic or electron beam radiation or cationic means. These means allow the coating composition to be used on thermoplastic materials such as polyester, and the like which may be damaged by heat or other curing means.

The coating composition is mixed by adding the selected components to the FLEXCOAT mixture, using standard mixing equipment. The resulting mixture is stirred for approximately one hour until a smooth homogeneous mixture is achieved. During the mixing process the temperature of the composition increases about 15° to 20° C. above ambient and becomes thinner. It is preferable therefore to allow the mixture to return to ambient conditions before using. The homogeneous mixture is stored in black plastic containers to protect the mixture from light during storage. Plastic rather than metal containers are preferred.

The preferred method of applying the coating is by screen printing techniques known in the art. The composition may be applied in one screening operation or a series of thin layers screened upon one another. Each of the thin layers is cured before additional layers are added. The thickness of the layer and the number of layers determines in part the dielectric strength of the coating, usually 1.5 to 2 mil in total thickness is used. Typically the minimum breakdown voltage required is 600 volts AC/mil. Applying the coating in a series of layers minimizers any problems with minute air or pinholes that may appear during the screening process. Maximum adhesion is achieved by allowing the coating to post cure period of about 24 to 48 hours.

FIGS. 1, 2, 2A and 3 show typical examples of uses for herein disclosed dielectric coating. In FIG. 1, a circuit panel 10 is comprised of a substrate 12 having a plurality of electrical conductor members 14 thereon. The substrate 12 further has a component mounting area 16 designed for surface mounting components (not shown) thereon. By design selected ones of the conductor members 14 extend into the component mounting area 16 to define component contact member mounting pads 18 within said component mounting area 16. In accordance with the invention, a dielectric cover layer 20 is applied to a portion of the substrate 12 outside the component connecting area 16 so as to cover the portions of the electrical conductor members 14 outside the component mounting area 16. The dielectric cover layer 20 is preferably screen printed onto the substrate 12 in liquid form and is thereafter cured by the application of ultraviolet light.

FIG. 2 is a cross section of the substrate 12 having dielectric cover layer 20 thereon. It can be seen that the cover layer 20 overlays conductor members 14 and that part of substrate 12 between said conductive members 14.

FIG. 2A shows a cross section of an insulated metal substrate 112 such as anodized aluminum wherein said insulative layer 22 is disposed between said metal and said conductor members 14 having conductive members 14 and dielectric cover layer 20 in accordance with the invention.

FIG. 3 illustrates the use of the dielectric cover layer 20 on the tail portion 24 of a membrane switch assembly 26 having a plurality of conductive members 28 thereon.

It will be understood that the Figures described above are representative examples of the various substrates and devices on which the dielectric cover material disclosed herein may be used. It will be further understood that the conductive members may be formed on the substrate by a variety of means known in the art. The conductive members may be conductive ink, discrete metal conductors or formed from a metal sheet which has been etched to form the desired pattern of traces by procedures known in the art.

Inn the drawings and specficiation, there has been set forth embodiments of the invention and although specific terms are employed, they are used in a generic and descriptive sense only, and not for purposes of limitation.

This invention as set forth in the preferred embodiment is intended for use at normal temperatures which would include at least the temperature range of −20° C. to 70° C.

The following examples illustrate the invention. They are not to be construed as limitations on the instant invention except as indicated in the appended claims. All compositions are expressed as parts by weight except where specifically indicated otherwise.

EXAMPLE NUMBER 1

A screen printable, radiation curable coating composition was formulated from the following components:

| | |
|---|---|
| FLEXCOAT | 68.38% |
| diallyl phthalate | 5.47% |
| 2,2-dimethoxy-2-phenyacetophenone | 1.37% |
| n-vinyl pyrollidone | 8.21% |
| acrylated urethane prepolymer | 16.47% |
| organosilane | .10% |
| | 100.00% |

FLEXCOAT is a premix of a thiolene prepolymer system and a partial percent of the total amount of crosslinking diluent monomers. The other components of the composition were added to the FLEXCOAT. There is no required order for adding components. For ease of mixing it is preferable to start with a component other than the urethane prepolymer. The resulting mixture was stirred for approximately one hour using a Fisher High Torque Stirrer, Model Number 14-500, until a smooth homogeneous mixture was achieved. During the mixing process, the temperature of the composition increased about 15° to 20°C. above ambient and the composition became thinner.

It is preferable to allow the mixture to return to ambient conditions before using. The homogeneous mixture is stored in black plastic containers to protect the mixture from light and contact with metals during storage.

Generally, samples of this formulation were screen printed onto polyester film having silver ink conductors deposited thereon by techniques known in the art. The coating was applied in three layers each being approximately 0.6 to 0.7 mils thick to achieve a cured layer 1.8-2 mils thick. The first layer was cured by ultraviolet light for approximately 2.5-3 seconds. Subsequent layers were applied and cured for the same amount of time. The samples were allowed to post cure for 24 hours before testing was begun.

The following tests were conducted on samples:
1. Samples were subjected to a temperature 85° C. for 10 days. The underlying conductive traces exhibited no stress fissures when magnified 67 times.
2. The breakdown voltage for a 2 mil layer was greater than 2500 volts AC.
3. Some samples were subjected to 95 percent humidity for 10 days at 85° C. No cracking was observed. The coating remained flexible and adhered to the substrate and coductors.

EXAMPLE NUMBER 2

A screen printable, radiation curable coating composition was formulated in the same manner as Example 1 from the following components:

| FLEXCOAT | 70.78% |
| --- | --- |
| diallyl phthalate | 5.66% |
| 2,2-dimethoxy-2-phenyacetophenone | 1.42% |
| n-vinyl pyrollidone | 8.49% |
| acrylated urethane prepolymer | 13.65% |
| | 100.00% |

The cured coating composition of Example 2 did not adhere apreciably to either copper or KAPTON but adhered well to other substrates.

EXAMPLE NUMBER 3

A screen printable, radiation curable coating composition was formulated in the same manner as Example 1 from the following components:

| FLEXCOAT | 76.86% |
| --- | --- |
| diallylphthalate | 6.15% |
| 2,2-dimethoxy-2-phenyacetophenone | 1.54% |
| n-vinyl pyrollidone | 9.22% |
| acrylated urethane prepolymer | 6.15% |
| organosilane | 0.08% |
| | 100.00% |

The cured coating composition of Example 3 exhibited minimal adhesion to copper and KAPTON. The cured layer was not as flexible as the composition of Example 1.

EXAMPLE NUMBER 4

A screenprintable, radiation curable coating composition was formulated in the same manner as Example 1 from the following components:

| FLEXCOAT | 68.43% |
| --- | --- |
| diallylphthalate | 5.47% |
| 2,2-dimethoxy-2-phenyacetophenone | 1.37% |
| n-vinyl pyrollidone | 8.21% |
| acrylated urethane prepolymer | 16.42% |
| organosilane | 0.10% |
| | 100.00% |

The cured composition was not as flexible as that of Example 1.

We claim:

1. A dielectric composition capable of being polymerized for use as an insulating coating for electrical conductor members formed on a substrate, said composition being comprised of:
   a. from about 10 to about 50 percent of an unsaturated thiolene prepolymer system;
   b. from about 20 to about 35 percent of an acrylated urethane prepolymer system, said system being compatible with said thiolene prepolymer acrylated system;
   c. from about 10 to about 40 percent of at least one crosslinking diluent monomer; and
   d. from about 4 to about 18 percent of at least one plasticizer, said at least one crosslinking diluent monomer and said at least one plasticizer being compatible with said unsaturated thiolene prepolymer and acrylated prepolymer systems; and
   e. catalyst means compatible with said thiolene and acrylated systems, said catalyst being activated by radiation means; whereby
upon applying a layer of said composition over at least a portion of said electrical conductor members and polymerizing said coating by radiation means, said composition is converted to a flexible insulating coating which is sufficiently compliant at normal temperatures to avoid cracking upon flexure or thermal expansion of the substrate.

2. The dielectric composition as defined in claim 1 wherein said unsaturated thiolene prepolymer system preferably comprises from 20 to 35 percent of the composition.

3. The dielectric composition as defined in claim 1 wherein said acrylated urethane prepolymer system preferably comprises from 20 to 35 percent of the composition.

4. The dielectric composition as defined in claim 1 wherein said at least one crosslinking diluent monomer preferably comprises from 15 to 25 percent of the composition.

5. The dielectric composition as defined in claim 1 wherein said at least one plasticizer preferably comprises from 7.5 to 12 percent of the composition.

6. The dielectric composition as defined in claim 1 wherein said unsaturated thiolene prepolymer system preferably comprises from 20 to 35 percent and said acrylated urethane prepolymer system preferably comprises from 25 to 35 percent of the composition.

7. The dielectric composition as defined in claim 1 wherein said thiolene prepolymer system comprises 20 to 35 percent of said composition; said crosslinking diluent monomer comprises 15 to 25 percent of said composition; and said at least one plasticizer comprises 7.5 to 12 percent of said composition.

8. The dielectric composition as defined in claim 1 wherein said catalyst means comprises from about 1 to about 10 percent of said composition.

9. The dielectric composition as defined in claim 8 wherein said catalyst means comprises from 3 to 5 percent of the composition.

10. The dielectric composition as defined in claim 1 wherein said catalyst means is a photoinitiator.

11. The dielectric composition as defined in claim 1 wherein said at least one plasticizer is diallyl phthalate.

12. The dielectric composition as defined in claim 1 wherein said composition is further comprised of an adhesion promoter.

13. The dielectric composition as defined in claim 12 wherein said adhesion promoter comprises up to 0.3 percent of said composition.

14. The dielectric composition as defined in claim 13 wherein said adhesion promoter comprises 0.05 to 0.15 percent of the composition.

* * * * *